(12) United States Patent
Kreischer

(10) Patent No.: US 10,267,876 B2
(45) Date of Patent: Apr. 23, 2019

(54) MAGNETIC RESONANCE APPARATUS WITH A COOLING APPARATUS

(71) Applicant: Siemens Aktiengesellschaft, Munich (DE)

(72) Inventor: Ludwig Kreischer, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 608 days.

(21) Appl. No.: 14/867,375

(22) Filed: Sep. 28, 2015

(65) Prior Publication Data

US 2016/0091580 A1 Mar. 31, 2016

(30) Foreign Application Priority Data

Sep. 30, 2014 (DE) .................. 10 2014 219 741

(51) Int. Cl.
*G01R 33/385* (2006.01)
*H01F 6/04* (2006.01)
*G01R 33/34* (2006.01)
*G01R 33/38* (2006.01)
*G01R 33/3815* (2006.01)

(52) U.S. Cl.
CPC ..... *G01R 33/3856* (2013.01); *G01R 33/3403* (2013.01); *G01R 33/3804* (2013.01); *H01F 6/04* (2013.01); *G01R 33/3815* (2013.01)

(58) Field of Classification Search
CPC ............ G01R 33/3403; G01R 33/3804; G01R 33/3856; G01R 33/3815; H01F 6/04
See application file for complete search history.

(56) References Cited

U.S. PATENT DOCUMENTS

| 2001/0019266 | A1* | 9/2001 | Nerreter | G01R 33/3856 324/322 |
| 2002/0148604 | A1* | 10/2002 | Emeric | G01R 33/28 165/206 |
| 2011/0284191 | A1* | 11/2011 | Jiang | G01R 33/3804 165/135 |
| 2012/0313642 | A1* | 12/2012 | Zia | G01R 33/3804 324/318 |
| 2015/0346296 | A1 | 12/2015 | Biber et al. | |

* cited by examiner

*Primary Examiner* — Patrick Assouad
*Assistant Examiner* — Haidong Zhang
(74) *Attorney, Agent, or Firm* — Schiff Hardin LLP

(57) ABSTRACT

A magnetic resonance apparatus has a scanner with a superconducting basic field magnet, a gradient coil unit, and a radio-frequency antenna unit, an electronics unit, and a cooling apparatus. The cooling apparatus has a cryostat for cooling the superconducting basic field magnet and a first cooling circuit for cooling the electronics unit and/or the gradient coil unit and/or the radio-frequency antenna unit, and a second cooling circuit for cooling the cryostat.

13 Claims, 2 Drawing Sheets

MAGNETIC RESONANCE APPARATUS WITH A COOLING APPARATUS

BACKGROUND OF THE INVENTION

1. Field of the Invention

The invention concerns a magnetic resonance apparatus with a scanner having a superconducting basic field magnet, a gradient coil unit and a radio-frequency antenna unit, an electronics unit and a cooling apparatus, wherein the cooling apparatus has a cryostat for cooling the superconducting basic field magnet and a cooling circuit for cooling the electronics unit and/or the gradient coil unit and/or the radio-frequency antenna unit.

2. Description of the Prior Art

Superconducting magnets in magnetic resonance apparatuses are permanently cooled with liquid helium even in a non-operating state of the magnetic resonance apparatus, in order to prevent an unwanted boil-off of helium. In order to cool the liquid helium and the magnet, the magnetic resonance apparatus has a cryostat. Such cryostats usually have a so-called cold head, which generates an operating coldness level of the magnet. Waste heat of approx. 5 KW, which must be discharged by a cooling apparatus, is produced at the cold head. This cooling apparatus must function very reliably in order to prevent the unwanted boil-off of helium.

SUMMARY OF THE INVENTION

An object of the present invention is to provide a reliable cooling apparatus for cooling a superconducting magnet of a magnetic resonance apparatus.

The invention is based on a magnetic resonance apparatus with a scanner that has a superconducting basic field magnet, a gradient coil unit and a radio-frequency antenna unit, an electronics unit and a cooling apparatus, wherein the cooling apparatus has a cryostat for cooling the superconducting basic field magnet and a cooling circuit for cooling the electronics unit and/or the gradient coil unit and/or the radio-frequency antenna unit.

in accordance with the invention the aforementioned cooling circuit is a first cooling circuit and wherein the cooling apparatus has a second cooling circuit for cooling the cryostat. A reliable cooling apparatus thus can be provided for cooling the superconducting basic field magnet unit. Moreover, the second cooling circuit can be specially tailored to the cooling properties of the cryostat such as for discharging thermal energy of approx. 5 KW up to a maximum of 10 KW so that a particularly reliable and simple second cooling circuit can be made available for the cryostat. The high reliability can be achieved for instance because this second cooling circuit can be designed with particularly simple components, such as a pump, a fan and a heat exchanger, which are particularly fail-safe. With such a simple and fail-safe design of the second cooling circuit, a direct and reliable cooling of the cryostat can moreover be achieved. Furthermore, this second cooling circuit can be operated independently of a refrigerating machine in an energy-saving and cost-saving manner. Due to the low operating costs of the second cooling circuit, investment costs for the cooling apparatus of the magnetic resonance apparatus having the two cooling circuits can be amortized.

The first cooling circuit is preferably coupled to a further, external cooling circuit by way of a heat ex-change unit. The second cooling circuit is preferably embodied separately from the first cooling circuit, so that upon an unwanted malfunction of the first cooling circuit and/or the further, external cooling circuit, the second cooling circuit for cooling the cryostat, and thus the superconducting basic field magnet can be advantageously retained. The cryostat preferably has a helium compressor and a cold head.

In a further embodiment, an operating state of the second cooling circuit is independent of an operating state of the first cooling circuit. An advantageous decoupling of the two cooling circuits can be achieved in this way, so that particularly during non-operation of the magnetic resonance apparatus, the first cooling circuit can be switched off and only the second cooling circuit for cooling the cryostat, and thus cooling the superconducting basic field magnet, has to be active. In this embodiment of the invention, a particularly cost-saving cooling apparatus can be provided for magnetic resonance apparatuses, since during non-operation of the magnetic resonance apparatus, only the second cooling circuit for cooling the cryostat, and thus cooling the superconducting basic field magnet, has to be active. Moreover, a particularly reliable cooling of the superconducting basic field magnet can also be provided in this way, since the second cooling circuit is designed with particularly simple and reliable and/or fail-safe components, such as a pump, a fan and a heat exchanger. Non-operation of the magnetic resonance apparatus means a fault state of the magnetic resonance apparatus and/or a switching-off of the magnetic resonance apparatus.

The second cooling circuit advantageously has a heat discharger, so that waste heat from the cryostat can be discharged particularly easily. A mode of operation of the heat discharger and/or an activation of the heat dis-charge unit is advantageously independent of and/or decoupled from the first cooling circuit.

The further cooling system can be operated here independently with respect of the first cooling circuit.

In another embodiment the heat discharger has a heat exchanger that is designed to discharge waste heat into an environment of the heat exchanger. Discharge heat from the cryostat can be discharged particularly easily directly into the environment of the heat exchanger. The heat exchanger preferably is a water-air heat exchanger, so that the heat exchanger is particularly cost-effective. By discharging the waste heat into an environment of the heat exchanger, for instance into air surrounding the heat exchanger unit, a heat exchanger with a particularly large refrigerating reservoir can be made available, and thus high reliability of the second cooling circuit is retained. The environment of the heat exchanger may, for instance, be air in an air-conditioned room in a clinical building, or air outside of a building in which the medical magnetic resonance apparatus is arranged.

Monitoring of a refrigerating reservoir of the second cooling circuit can be achieved by providing the second cooling circuit with a temperature sensor unit for detecting an ambient temperature of the heat discharger. Moreover, here the cryostat can be protected from over-heating, for instance if the ambient temperature of the heat discharger is too high and is no longer sufficient to cool the cryostat. A mode of operation of the temperature sensor unit and/or an activation of the temperature sensor unit is preferably independent of and/or decoupled from the first cooling circuit, so that the second cooling circuit can be operated here independently in respect of the first cooling circuit.

In another embodiment the heat discharger is arranged outside of an examination room, within which the magnet unit is disposed. A mode of operation of the second cooling circuit can be retained here independently of a mode of operation of the magnetic unit. Moreover, heating of the examination room, and thus of the scanner, due to a heat discharge of the heat discharger can be prevented. The examination room is advantageously outwardly shielded with respect to electromagnetic radiation. The electronics unit can be arranged in a control zone, wherein the heat discharger is preferably also arranged outside of the control zone.

In a further embodiment of the invention, the second cooling circuit has a fan, which operates to cause waste heat to be discharged by the heat discharger, in particular the first heat exchanger. Heating of the environment of the heat discharger, in particular the air around the heat discharger, can be advantageously prevented. A mode of operation of the fan and/or an activation of the fan is independent of and/or decoupled from the first cooling circuit, so that the second cooling circuit can be operated independently with respect to the first cooling circuit. The fan can be integrated within the first heat exchanger.

In a further embodiment of the invention, the second cooling circuit has a pump unit. The pump unit circulates a cooling fluid, such as water, within the second cooling circuit. A mode of operation of the pump and/or an activation of the pump is preferably independent of and/or decoupled from the first cooling circuit. The second cooling circuit can be operated independently with respect to the first cooling circuit.

In a further embodiment of the invention, the second cooling circuit has a control computer. A cooling operation of the second cooling circuit can be monitored and thus reliability of a cooling of the cryostat increased. Moreover, an unwanted boil-off of helium can be prevented in this way. The control computer preferably has a processor and software and/or computer programs required for acquiring data and/or for evaluating data and/or for con-trolling individual components of the second cooling circuit, which run in order to execute a corresponding application, for instance control and/or monitoring of the second cooling circuit, within the control computer. An operating state of the second cooling circuit thus can be monitored independently of an operating state of the first cooling circuit.

The control computer can set a cooling mode of the further cooling system up to a maximum ambient temperature with a value of 40°. The control computer is preferably embodied to set a cooling mode of the further cooling system up to an ambient temperature of the first heat exchanger with a maximum value of 35° C., advantageously with a maximum value of 30° C., and preferably with a maximum value of 25° C. In this embodiment of the invention, a particularly cost-effective cooling can be achieved, which makes available, almost at any time, a large and cost-effective refrigerating reservoir. A control function and/or a monitoring function of the control computer can moreover minimize or prevent a boil-off of helium.

In a further embodiment of the invention, the second cooling circuit has at least one valve, which is controlled by the control computer as a function of an acquired ambient temperature of the heat discharger. The valve can be used to interrupt and/or redirect the second cooling circuit in the event of an excessive ambient temperature of the first heat exchanger so that an unwanted application of heat into the cryostat can be advantageously prevented. A mode of operation of the valve and/or an activation of the valve is advantageously independent of and/or decoupled from the first cooling circuit, so that the second cooling circuit can be operated here independently with respect to the first cooling circuit.

Moreover, the control computer can be configured to control the pump. The control of the pump preferably takes place as a function of the acquired ambient temperature of the first heat exchanger.

In a further embodiment of the invention, the cooling apparatus has a further heat exchanger, via which the second cooling circuit can be coupled to an external cooling circuit. In this context, a coupling of the second cooling circuit to the external cooling circuit means a thermal coupling between the second cooling circuit and the external cooling circuit, the thermal coupling taking place via the further heat exchanger. With this embodiment of the invention, the second cooling circuit can be supported, particularly if an ambient temperature of an environment of the heat discharger is so high that a complete cooling of the cryostat via the heat discharger of the second cooling circuit to an environment of the heat discharger of the second cooling circuit can no longer be ensured. A particularly cost-effective further heat exchanger can be provided when the further heat exchanger is a water-water heat exchanger.

In another embodiment of the invention, the control computer is configured to control coupling of the second cooling circuit to the external cooling circuit. An automatic control of the coupling of the second circuit with the external cooling circuit can be implemented such that an ideal cooling of the cryostat is always available. The coupling of the second cooling circuit with the external cooling circuit can also take place as a function of an acquired ambient temperature of the heat discharger of the second cooling circuit, so that overheating of the cryostat can be prevented in the event of a high ambient temperature of the heat discharger. Moreover, the coupling of the second cooling circuit with the external cooling circuit can take place as a function of an acquired temperature and/or an acquired state of the external cooling circuit, so that in the event of a failure of the external cooling circuit for instance, a coupling still remains between the second cooling circuit and the external cooling circuit. To this end the second cooling circuit preferably has a corresponding arrangement of valves, which are controlled by the control computer and by which coupling and/or decoupling can be implemented between the second cooling circuit and the external cooling circuit.

Moreover, the second cooling circuit can have a further temperature sensor for acquiring a return temperature of the further heat exchanger. Heat intake of the external cooling circuit can be detected and thus an unwanted heat discharge to the second cooling circuit, such as during a malfunction of the external cooling circuit, can be prevented.

In a further embodiment of the invention, the cooling apparatus has a heat exchanger, via which the first cooling circuit can be coupled to an external cooling circuit.

DESCRIPTION OF THE PREFERRED EMBODIMENTS

Figure 1:
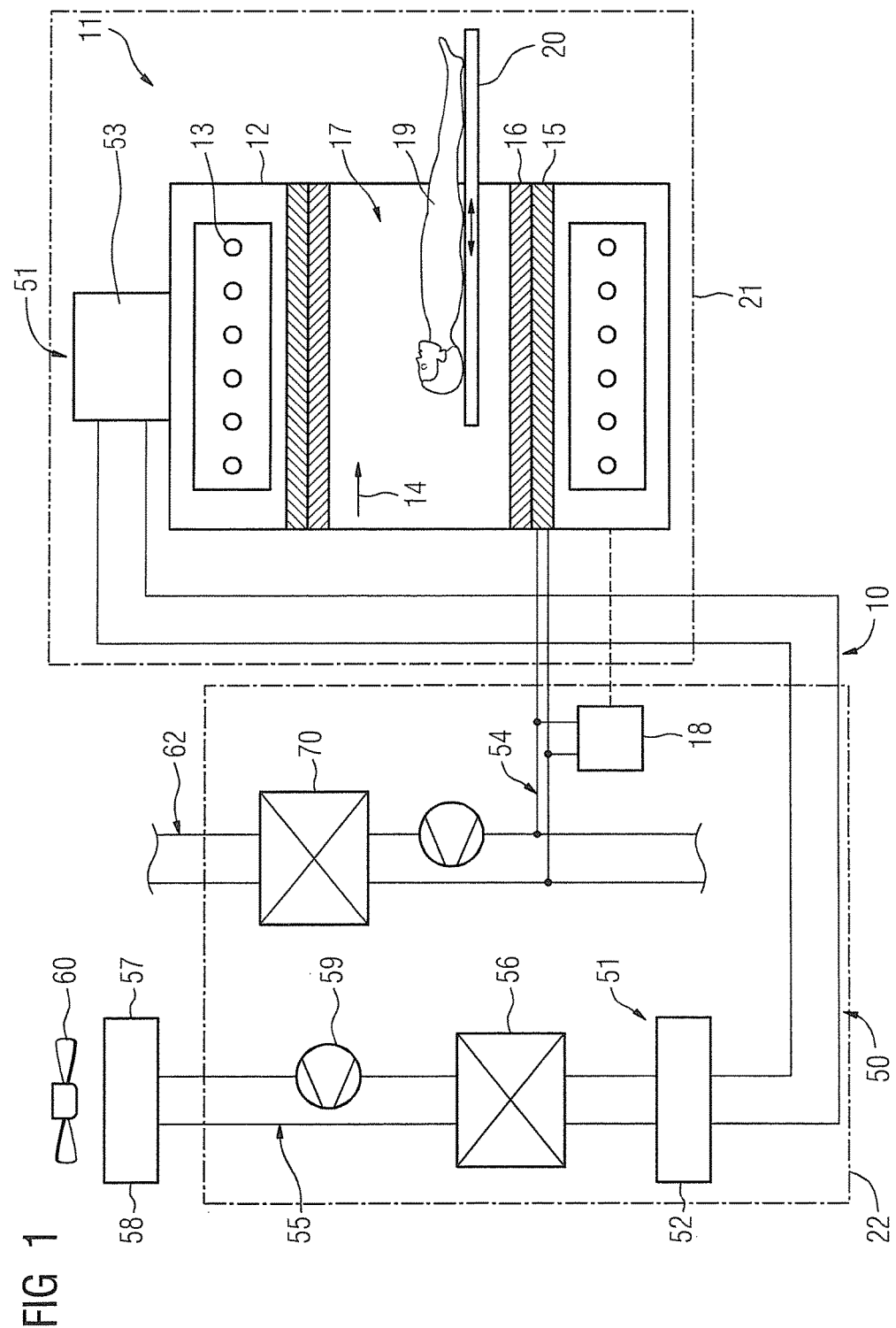
FIG. 1 schematically illustrates an inventive magnetic resonance apparatus with a cooling apparatus.

A magnetic resonance apparatus 10 is shown schematically in FIG. 1. The magnetic resonance apparatus 10 has a scanner 11 with a superconducting basic field magnet 12, which has a superconducting magnetic coil 13 or a number of superconducting magnetic coils 13 for generating a strong and constant basic magnetic field 14.

For operation of the magnetic resonance apparatus 10, it is necessary for the one superconducting magnetic coil 13 or the number of superconducting magnetic coils 13 to be cooled with a cooling fluid formed by liquid helium to a temperature of approx. −270° C. To this end, the magnetic resonance apparatus 10 has a cooling apparatus 50 with a cryostat 51. The cryostat 51 has a helium compressor 52 and a cold head 53 for cooling the liquid helium. The superconducting magnetic coil 14 is outwardly shielded by a magnet housing.

The scanner 11 also has a gradient coil unit 15 for generating magnetic field gradients that are used for position encoding during imaging. The scanner 11 furthermore has a radio-frequency antenna unit 16 for exciting nuclear spins in a subject so as to deviate from the polarization established in the basic magnetic field 14 generated by the basic field magnet 12. The radio-frequency antenna unit 16 radiates radio-frequency magnetic resonance sequences into a patient receiving zone 17 of the scanner 11. Moreover, the magnetic resonance apparatus 10 has an electronics unit 18, which is configured to control the gradient coil unit 15 and to control the radio-frequency antenna unit 16. The electronics unit 18 includes control unit, an evaluation unit, a processor unit, etc. The electronics unit 18 is shown only schematically in FIG. 1.

Furthermore, the magnetic resonance apparatus 10 has a cylindrical patient receiving zone 17 for receiving a patient 19. The patient receiving zone 17 is cylindrically enclosed by the scanner 11 in a peripheral direction. The patient 19 can be introduced into the patient receiving zone 17 by a patient support apparatus 20 of the magnetic resonance apparatus 10. To this end the patient support apparatus 20 has a bed, which is disposed in a movable manner within the scanner 11 in a longitudinal extension of the bed.

The scanner 11 of the magnetic resonance apparatus 10 is arranged within an examination room 21. Moreover, the cold head 53 of the cryostat 51 is also arranged on the scanner 11 and thus within the examination room 21. The examination room 21 is outwardly shielded with respect to electromagnetic radiation. By contrast, the electronics unit 18 and the helium compressor 52 of the cryostat 51 are arranged outside of the examination room 21 in a control room 22 of the magnetic resonance apparatus 10.

Figure 2:
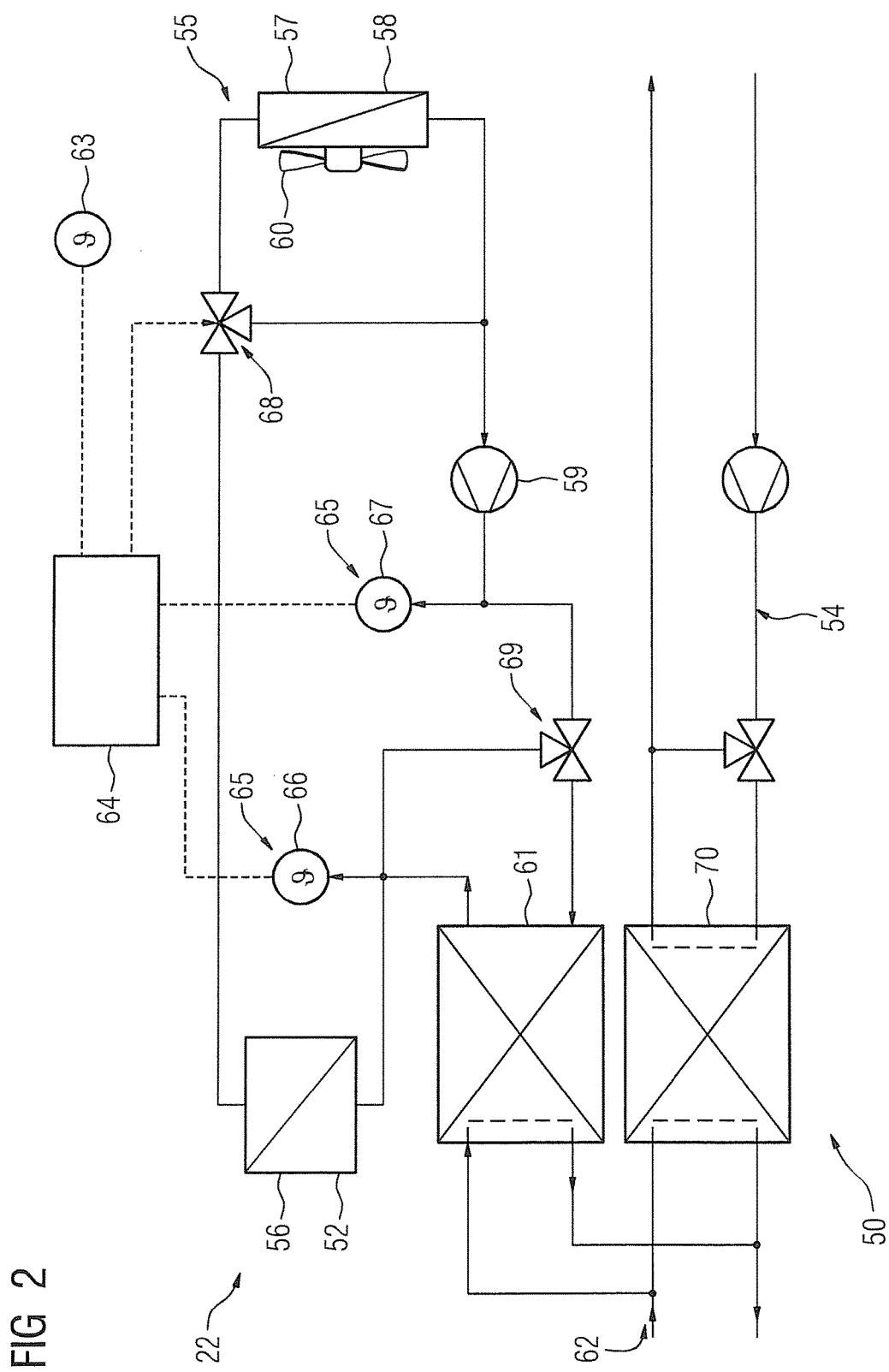
FIG. 2 shows a detailed view of the cooling apparatus.

The cooling apparatus 50 is shown in more detail in FIGS. 1 and 2 and has a first cooling circuit 54, which is embodied and/or configured to cool the electronics unit 18 and/or the gradient coil unit 15 and/or the radio-frequency antenna unit 16 and/or further units of the magnetic resonance apparatus 10, which appear meaningful to those skilled in the art. The first cooling circuit 54 has cooling lines, which connect the units to be cooled, and a cooling fluid of the first cooling circuit 54 circulates in the cooling lines. The cooling fluid of the first cooling circuit 54 is water in the present exemplary embodiment. Further embodiments of the cooling fluid of the first cooling circuit 54 can be selected by those skilled in the art.

Moreover, the cooling apparatus 50 has a second cooling circuit 55 for cooling the cryostat 51. The second cooling circuit 55 couples to the helium compressor 52 of the cryostat 50. The coupling takes place for instance via a first heat exchanger 56 of the cooling apparatus 50. The first heat exchanger 56 can be integrated into the helium compressor 52 for instance. The second cooling circuit 55 is configured to cool the cryostat 51 with a cooling power of approx. 5 KW to a maximum of 10 KW, as a result of which the second cooling circuit 55 can be kept particularly compact.

The second cooling circuit 55 has cooling lines, wherein a cooling fluid of the second cooling circuit 55 circulates in the cooling lines. The cooling fluid of the second cooling circuit 55 is water in the present exemplary embodiment. Further embodiments of the cooling fluid of the second cooling circuit 55 can be selected by those skilled in the art.

An operating state of the second cooling circuit 55 is independent of an operating state of the first cooling circuit 54, so that cooling of the cryostat 51, during a mal-function and/or non-operation of the first cooling circuit 54, such as for instance a switching-off of the first cooling circuit 54, takes place. The second cooling circuit 55 is decoupled, in particular thermally decoupled, from the first cooling circuit 54 within the magnetic resonance apparatus 10.

The second cooling circuit 55 has a heat discharger 57 that has a second heat exchanger 58. Thermal energy from the second cooling circuit is transferred by the heat discharger 57 to an environment, in particular to ambient air, of the heat discharger 57. Here the second heat exchange unit 58 comprises an air-water heat exchanger.

Moreover, the second cooling circuit 55 has a pump 59 and a fan 60. The pump 59 allows the cooling fluid of the second cooling circuit 55 to circulate within the second cooling circuit 55 during cooling operation, in particular within the cooling lines of the second cooling circuit, with the pump 59 being arranged within the second cooling circuit 55. The fan 60 of the second cooling circuit 55 is arranged so as to support the heat discharger 57. During operation of the fan 60, heating of ambient air of the heat discharger 57 is prevented, so that a more reliable heat discharge can be achieved in a cooling mode of the second cooling circuit 55 by operation of the heat discharger 57.

The second heat exchanger 58 and the fan 60 of the second cooling circuit 55 are situated outside of the examination room 21, in which the scanner 11 of the magnetic resonance apparatus 10 is situated, as well as outside of the control room 22 of the magnetic resonance apparatus 10. In particular, the second heat exchanger 58 and the fan 59 are arranged on an external wall of the building and/or within an air-conditioned room so that heat exchange with an environment of the second heat exchanger 58 can advantageously take place, and heating of the examination room 21 and/or of the control room 22 can also be prevented.

The cooling apparatus 50 also has a third heat exchanger 61, via which the second cooling circuit 55 is coupled to a third cooling circuit, which is formed by an external cooling circuit 62. The external cooling circuit 62 is connected for instance to a water circuit of the building in which the magnetic resonance apparatus 10 is arranged. The cooling fluid of the external cooling circuit 62 is water in the present exemplary embodiment. In the present exemplary embodiment, the third heat exchanger 61 is a water-water heat exchanger. The third heat exchanger 61 is configured to exchange thermal energy of approx. 5 KW up to a maximum of 10 KW.

The second cooling circuit 55 further has a temperature sensor 63 that detects (senses) the ambient temperature of the heat discharger 57 and a control processor 64. The control processor 64 is configured to monitor the second cooling circuit 55 and the cooling function of the second cooling circuit 55, and thus to prevent an unwanted supply of heat into the cryostat 51, in particular into the helium compressor 52. To this end the temperature sensor unit 63 is connected to the control processor 64, so that the temperature data acquired by the temperature sensor 63 can be evaluated by the control processor 64 and used to control the second cooling circuit 55.

Moreover, the second cooling circuit 55 has a further temperature sensor 65. A return temperature of the third heat exchanger 61 is sensed by the further temperature sensor 65 as well as a return temperature of the second heat exchanger 58. To this end, the further temperature sensor 65 has two sensor elements 66, 67 that are arranged at respective locations within the second cooling circuit 55. The further temperature sensor 65 is likewise connected to the control processor 64, so that the temperature data acquired by the further temperature sensor 65 can be evaluated by the control processor 64 and used to control the second cooling circuit 55.

Moreover, the second cooling circuit 55 has a first valve 68 and a second valve 69. The first valve 68 and the second valve 69 are both controlled by the control processor 64. The first valve 68 is controlled here as a function of the acquired ambient temperature of the second heat exchanger 58 and the second valve 69 is controlled as a function of the acquired return temperature of the third heat exchanger 61. In addition, the two valves 68, 69 are controlled by the control processor 64 as a function of the acquired return temperature of the second heat exchanger 57.

In a cooling operating state, the control processor 64 sets an operating mode, in particular a cooling mode, of the second cooling circuit 55. In the exemplary embodiment, three different operating modes, namely cooling modes, of the second cooling circuit 55 are available to the control processor 64. A first operating mode, in particular a first cooling mode, of the second cooling circuit 55 is set by the control processor 64 as a function of the ambient temperature of the second heat exchanger 58 acquired by the temperature sensor 63. In the first cooling mode of the second cooling circuit 55, the cooling of the cryostat 51 takes place exclusively via the second heat exchanger 58 of the second cooling circuit 55. To this end, individual valves 68, 69 are activated by the control processor 64 so that the second cooling circuit 55 is independent of, in particular thermally decoupled from, the external cooling circuit 62.

The first cooling mode of the second cooling circuit 55 is set by the control processor 64 up to a maximum ambient temperature of the heat discharger 57 of 40° C. The control processor 64 is preferably designed to set the first cooling mode of the second cooling circuit 55 up to an ambient temperature of the heat discharger 57 with a maximum value of 35° C., preferably with a maximum value of 30° C., or more preferably with a maximum value of 25° C. In this way, heating the second cooling circuit 55 and thus also the cryostat 51 can be advantageously prevented if the ambient temperature of the heat discharger 57 has a temperature, due to which cooling of the helium compressor 52 can no longer be guaranteed by the second cooling circuit 5.

A second mode of operation, in particular a second cooling mode, of the second cooling circuit 55 is likewise set and/or controlled by the control processor 64. In order to support the heat discharge via the second heat exchanger 58, a heat discharge by the third heat exchanger 61 and the external cooling circuit 62 is set and controlled. The support of the heat discharge by the third heat exchanger 61 and the external cooling circuit 62 is particularly meaningful when the ambient temperature of ambient air of the second heat exchanger 58 is greater than 25° C., preferably greater than 30° C. and more preferably greater than 35° C., so that a reliable cooling of the cryostat 51 during a longer time span can no longer be guaranteed solely by operation of the second heat exchanger 58.

In order to set and/or activate the second cooling mode of the second cooling circuit 55, the individual valves 68, 69 and the pump 59 are switched by the control processor 64 as a function of the acquired temperature values, in particular a temperature value of the environment of the second heat exchanger 58 and the return temperature of the second heat exchanger 58, of the first temperature sensor 63 and the second temperature sensor 65. The return temperature of the second heat exchanger 58 thus can be used to determine a variable of a heat discharge to the second heat exchanger 58 by the control processor 64, and with an additional cooling requirement, a heat discharge can be switched by means of the third heat exchanger 61 and the external cooling circuit 62.

A third mode of operation, in particular a third cooling mode, of the second cooling circuit 55 is likewise set and/or controlled by the control processor 64. In the third cooling mode, the discharge of thermal energy of the second cooling circuit 55, and thus the cooling of the cryostat 51 is exclusively effective via the third heat exchanger 61 and the external cooling circuit 62. This is particularly the case if the ambient temperature of the heat discharger 57, in particular the second heat exchanger 58, is so great that heat discharge via the second heat exchanger 58 to the environment of the second heat exchanger 58 is no longer possible and heating of the second cooling circuit 55 by receiving thermal energy from the environment of the second heat exchanger 58 takes place. A temperature of the environment of the heat discharger 57, in particular the second heat exchanger 58, is greater here than 40° C., more preferably greater than 35° C., preferably greater than 30° C. and most preferably greater than 25° C.

One prerequisite for the second operating mode, in particular the second cooling mode, and the third operating mode, in particular the third cooling mode, of the second cooling circuit 55 is that the external cooling circuit 62 is disposed in a fault-free operating state. Only then is a connection of the external cooling circuit 62 possible and a corresponding control is also executed by the control processor 64. Monitoring of a malfunction-free operating state of the external cooling circuit 62 takes place by acquiring the return temperature of the third heat exchanger 61. Moreover, in an alternative embodiment further monitoring parameters can be acquired by the control processor 64 and/or further acquisition units, with which an operating state of the further, external cooling circuit 61 can be defined by the control processor 64.

A selection of the individual operating modes, in particular cooling modes, of the second cooling circuit 55 and/or a set-ting of the individual operating modes, in particular cooling modes, of the second cooling circuit 55 and/or a control of the individual operating modes, in particular cooling modes, of the second cooling circuit 55 takes place automatically by the control processor 64. The control processor 64 to this end has a processor unit (not shown) and software and/or computer pro-grams required for acquiring data and/or for evaluating data and/or for controlling individual components of the cooling apparatus 50, which run in order to execute a corresponding application within the control processor 64.

The cooling apparatus 50 has a fourth heat exchanger 70, via which the first cooling circuit 54 is coupled to the external cooling circuit 62 in order to discharge thermal energy. Here the fourth heat exchanger 70 has a water-water heat exchanger. The fourth heat exchanger 70 is configured to exchange thermal energy of approx. 50 KW.

In order to exchange data between the control processor 64 and the units controlled by the control processor 64, these are connected to the control processor 64 via a data transfer unit (not shown in further detail). The data transfer unit can be configured for wireless exchange of data between the control processor 64 and the further units. Moreover, the data acquired by the individual temperature sensors 63, 65 are also transferred to the control processor 64 via the data transfer unit.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a magnetic resonance scanner comprising a superconducting basic field magnet, a gradient coil unit, and a radio-frequency antenna unit and an electronics unit;
   said magnetic resonance scanner comprising a cooling apparatus having a cryostat that cools the superconducting basic field magnet and a first cooling circuit that cools at least one of the electronics unit, the gradient coil unit, and the radio-frequency antenna unit by circulating a first coolant in said first cooling circuit;
   said cooling apparatus further comprising a second cooling circuit that cools the cryostat by circulating a second coolant, which is not said first coolant, in said second coolant circuit, said second cooling circuit having a coolant flowing therein, and comprising a heat exchanger through which said coolant flows, said heat exchanger discharging waste heat from said coolant flowing through said heat exchanger into an environment of said heat exchanger; and
   a control computer that operates each of said first cooling circuit and said second cooling circuit, said control computer being configured to operate said second cooling state in an operating state that is independent of an operating state of said first cooling circuit so that if said first cooling circuit fails, said second cooling circuit remains operational.

2. A magnetic resonance apparatus as claimed in claim 1 wherein said second cooling circuit comprises a temperature sensor that detects an ambient temperature of said heat discharger.

3. A magnetic resonance apparatus as claimed in claim 1 wherein said heat discharger is situated outside of an examination room in which said magnetic resonance scanner is situated.

4. A magnetic resonance apparatus as claimed in claim 1 wherein said second cooling circuit comprises a fan.

5. A magnetic resonance apparatus as claimed in claim 1 wherein said second cooling circuit comprises a pump.

6. A magnetic resonance apparatus as claimed in claim 1 comprising a control processor configured to operate said second cooling circuit.

7. A magnetic resonance apparatus as claimed in claim 6 wherein said control processor is configured to set a cooling mode of said second cooling circuit up to a maximum ambient temperature at said heat discharger of 40° C.

8. A magnetic resonance apparatus as claimed in claim 7 wherein said second cooling circuit comprises a valve that is controlled by said control processor dependent on said ambient temperature of said heat discharger.

9. A magnetic resonance apparatus as claimed in claim 6 wherein said second cooling circuit comprises a pump, and wherein said control processor is configured to control said pump.

10. A magnetic resonance apparatus as claimed in claim 1 wherein said cooling apparatus comprises a further heat exchanger that couples said second cooling circuit to an external cooling circuit.

11. A magnetic resonance apparatus as claimed in claim 10 comprising a control processor configured to control coupling of said second cooling circuit with said external cooling circuit.

12. A magnetic resonance apparatus as claimed in claim 11 wherein said second cooling circuit comprises a temperature sensor that detects a return temperature of said further heat exchanger and that supplies an electronic signal representing said return temperature to said control processor, and wherein said control processor is configured to control said coupling of said second cooling circuit with said external cooling circuit dependent on said return temperature.

13. A magnetic resonance apparatus as claimed in claim 1 wherein said first cooling circuit comprises a further heat exchanger that couples said first cooling circuit to an external cooling circuit.

* * * * *